(12) United States Patent
Sakamoto

(10) Patent No.: US 7,754,583 B2
(45) Date of Patent: Jul. 13, 2010

(54) LASER PROCESSING METHOD

(75) Inventor: Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/094,050

(22) PCT Filed: Nov. 16, 2006

(86) PCT No.: PCT/JP2006/322871
§ 371 (c)(1),
(2), (4) Date: Feb. 6, 2009

(87) PCT Pub. No.: WO2007/058262
PCT Pub. Date: May 24, 2007

(65) Prior Publication Data
US 2009/0162994 A1      Jun. 25, 2009

(30) Foreign Application Priority Data
Nov. 18, 2005    (JP)    ............................. 2005-334734

(51) Int. Cl.
*H01L 21/301* (2006.01)
(52) U.S. Cl. ............................... 438/463; 257/E21.238
(58) Field of Classification Search ................. 438/463, 438/938; 257/E21.238
See application file for complete search history.

(56) References Cited

U.S. PATENT DOCUMENTS

| | | | |
|---|---|---|---|
| 6,322,958 B1 * | 11/2001 | Hayashi | 430/495.1 |
| 6,656,749 B1 * | 12/2003 | Paton et al. | 438/5 |
| 6,992,026 B2 | 1/2006 | Fukuyo et al. | |
| 2006/0148212 A1 | 7/2006 | Fukuyo et al. | |
| 2007/0158314 A1 | 7/2007 | Fukumitsu et al. | |
| 2007/0287267 A1 | 12/2007 | Sakamoto et al. | |

(Continued)

FOREIGN PATENT DOCUMENTS

JP    47-45271    12/1972

(Continued)

OTHER PUBLICATIONS

K. Hayashi; "Inner Glass Marking by Harmonics of Solid-State Laser", Proceedings of 45th Laser Materials Processing Conference, Dec. 1998, pp. 23-28.

(Continued)

*Primary Examiner*—Chandra Chaudhari
(74) *Attorney, Agent, or Firm*—Drinker Biddle & Reath LLP

(57) ABSTRACT

A laser processing method which can securely prevent particles from attaching to chips obtained by cutting a planar object is provided. When applying a stress to an object to be processed 1 through an expandable tape 23, forming materials of the object 1 (the object 1 formed with molten processed regions 13, semiconductor chips 25 obtained by cutting the object 1, particles produced from cut sections of the semiconductor chips 25, and the like) are irradiated with soft x-rays. As a consequence, the particles produced from the cut sections of the semiconductor chips 25 obtained by cutting the object 1 fall on the expandable tape 23 without dispersing randomly. This can securely prevent the particles from attaching to the semiconductor chips 25 obtained by cutting the object 1.

3 Claims, 20 Drawing Sheets

U.S. PATENT DOCUMENTS

2007/0290299 A1    12/2007    Sakamoto et al.

FOREIGN PATENT DOCUMENTS

| JP | 63-260407 | 10/1988 |
| JP | 3-261162 | 11/1991 |
| JP | 8-190992 | 7/1996 |
| JP | 2001-211044 | 8/2001 |
| JP | 2002-066865 | 3/2002 |
| JP | 2005-129607 | 5/2005 |
| JP | 2005-223285 | 8/2005 |
| WO | WO 2004/051721 | 6/2004 |
| WO | WO 2004/082006 | 9/2004 |
| WO | WO 2005/098914 | 10/2005 |
| WO | WO 2005/098915 | 10/2005 |
| WO | WO 2005/098916 | 10/2005 |

OTHER PUBLICATIONS

K. Miura et al., "Formation of Photo-Induced Structures in Glasses with Femtosecond Laser", Proceedings of $42^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner (a)

(b)

(a)

(b)

(a)

(b)

LASER PROCESSING METHOD

TECHNICAL FIELD

The present invention relates to a laser processing method for cutting a planar object to be processed along a line to cut.

BACKGROUND ART

Conventionally known as a technique of this kind is a wafer dividing method which irradiates a wafer with laser light transmittable through the wafer along a line to cut, so as to form a modified layer within the wafer along the line to cut, and then expands an expandable protective tape attached to one surface of the wafer, thereby dividing the wafer along the modified layer (see, for example, Patent Document 1).

Patent Document 1: Japanese Patent Application Laid-Open No. 2005-129607

DISCLOSURE OF THE INVENTION

Problem to be Solved by the Invention

When the wafer is divided into a plurality of chips by the above-mentioned method, however, particles may attach to the chips. In MEMS wafers and the like having fragile films in particular, it is necessary to securely prevent the particles from attaching to the chips obtained by cutting the wafer.

In view of such circumstances, it is an object of the present invention to provide a laser processing method which can securely prevent particles from attaching to chips obtained by cutting a planar object to be processed.

Means for Solving Problem

For achieving the above-mentioned object, the laser processing method in accordance with one aspect of the present invention comprises the steps of irradiating a planar object to be processed with laser light while locating a converging point within the object, so as to form a modified region to become a cutting start point within the object along a line to cut in the object; and applying a stress to the object through an elastic sheet, so as to separate a plurality of chips from each other, the chips being obtained by cutting the object along the line to cut from the modified region acting as the cutting start point; wherein a forming material of the object is destaticized when applying the stress to the object through the sheet.

When the stress is applied to the object through the sheet in this laser processing method, the forming material of the object is destaticized. As a consequence, particles produced from cut sections of chips obtained by cutting the object along the line to cut from the modified region acting as the cutting start point fall on the sheet, for example, without dispersing randomly. Therefore, this laser processing method can securely prevent particles from attaching to chips obtained by cutting a planar object to be processed.

The modified region to become the cutting start point is formed by causing optical absorption such as multiphoton absorption within the object to be processed by irradiating the object with laser light while locating a converging point within the object. The forming material of the object to be processed refers to materials forming or having formed the object, specific examples of which include the object formed with the modified region, chips obtained by cutting the object, and particles produced from cut sections of the chips.

The laser processing method in accordance with another aspect of the present invention comprises the steps of irradiating a planar object to be processed with laser light while locating a converging point within the object, so as to form a modified region to become a cutting start point within the object along a line to cut in the object; and applying a stress to the object through an elastic sheet, so as to separate a plurality of chips from each other, the chips being obtained by cutting the object along the line to cut from the modified region acting as the cutting start point; wherein a forming material of the object is irradiated with a soft x-ray when applying the stress to the object through the sheet.

When the stress is applied to the object through the sheet in this laser processing method, the forming material of the object is irradiated with a soft x-ray. As a consequence, particles produced from cut sections of chips obtained by cutting the object along the line to cut from the modified region acting as the cutting start point fall on the sheet, for example, without dispersing randomly. Therefore, this laser processing method can securely prevent particles from attaching to chips obtained by cutting a planar object to be processed.

In the laser processing methods in accordance with the present invention, the step of separating the chips from each other may cut the object along the line to cut from the modified region acting as the cutting start point by applying a stress to the object through the sheet.

In the laser processing methods in accordance with the present invention, the object may be equipped with a semiconductor substrate, while the modified region may include a molten processed region.

EFFECT OF THE INVENTION

The present invention can securely prevent particles from attaching to chips obtained by cutting a planar object to be processed.

EXPLANATIONS OF NUMERALS OR LETTERS

1 . . . object to be processed; 5 . . . line to cut; 7 . . . modified region; 11 . . . silicon wafer (semiconductor substrate); 13 . . . molten processed region; 23 . . . expandable tape (sheet); 25 . . . semiconductor chip (chip); L . . . laser light; P . . . converging point

BEST MODES FOR CARRYING OUT THE INVENTION

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
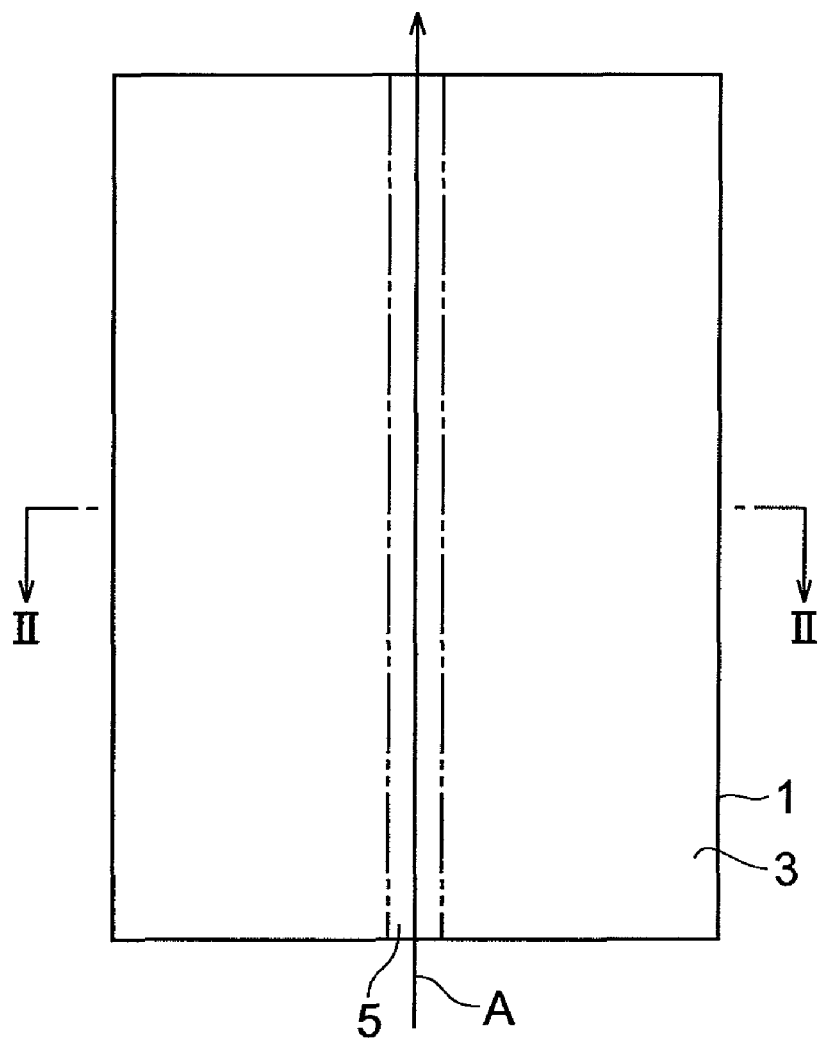
FIG. 1 is a plan view of an object to be processed during laser processing by the laser processing method in accordance with an embodiment.
Figure 2:
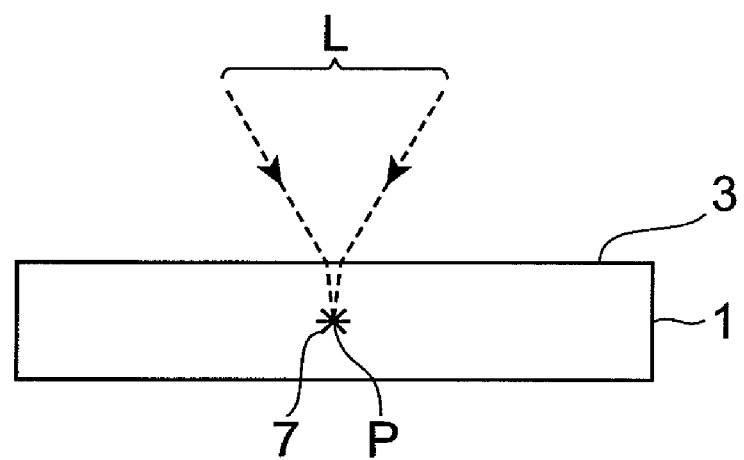
FIG. 2 is a sectional view of the object taken along the line II-II of FIG. 1.

The principle of the laser processing method in accordance with an embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
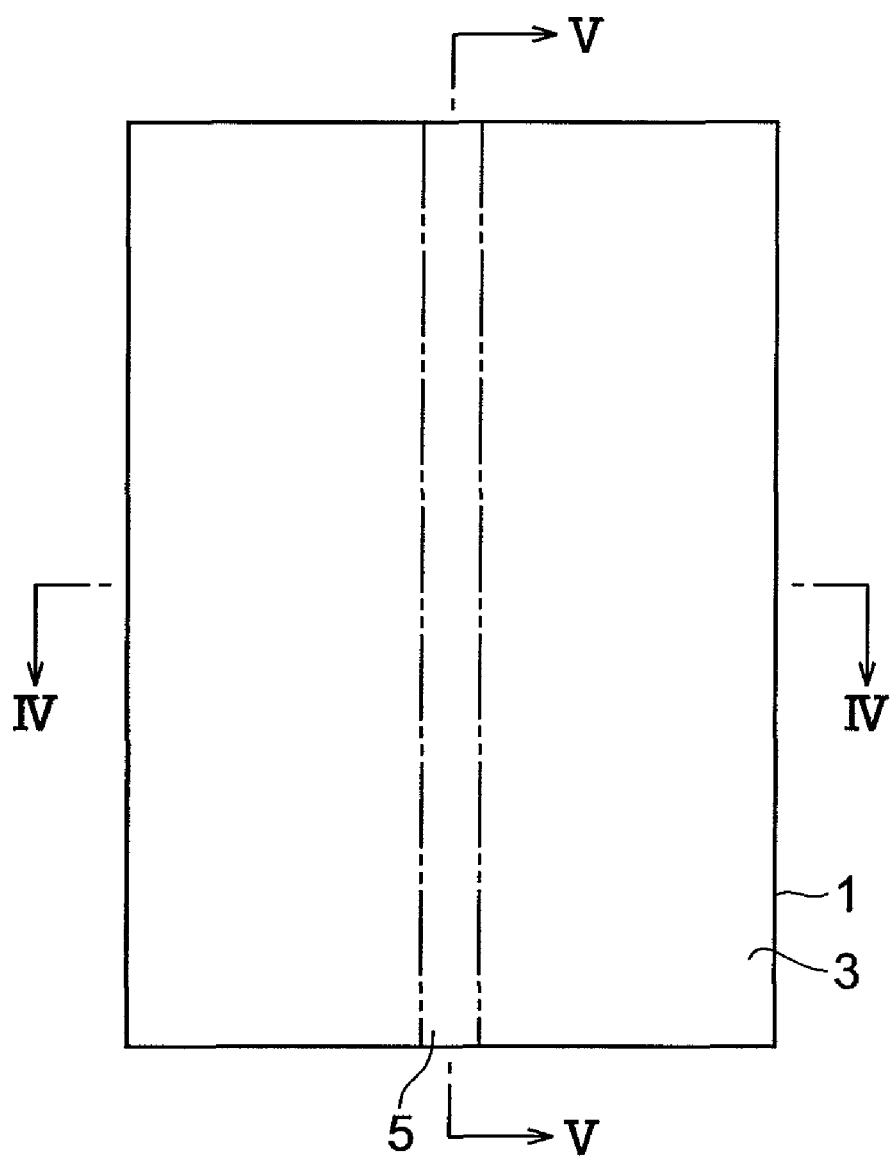
FIG. 3 is a plan view of the object after the laser processing by the laser processing method in accordance with the embodiment.
Figure 4:
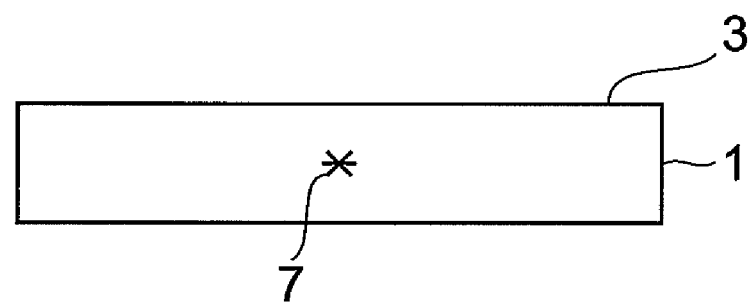
FIG. 4 is a sectional view of the object taken along the line IV-IV of FIG. 3.
Figure 5:
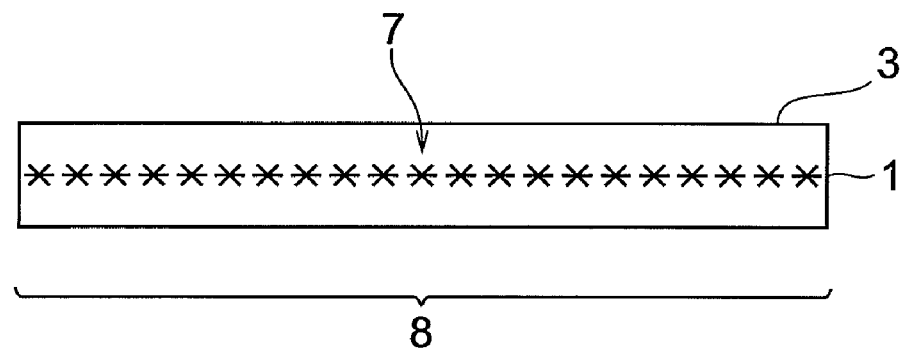
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the front face 3 of the object 1 hardly absorbs the laser light L and thus does not melt.

Figure 6:
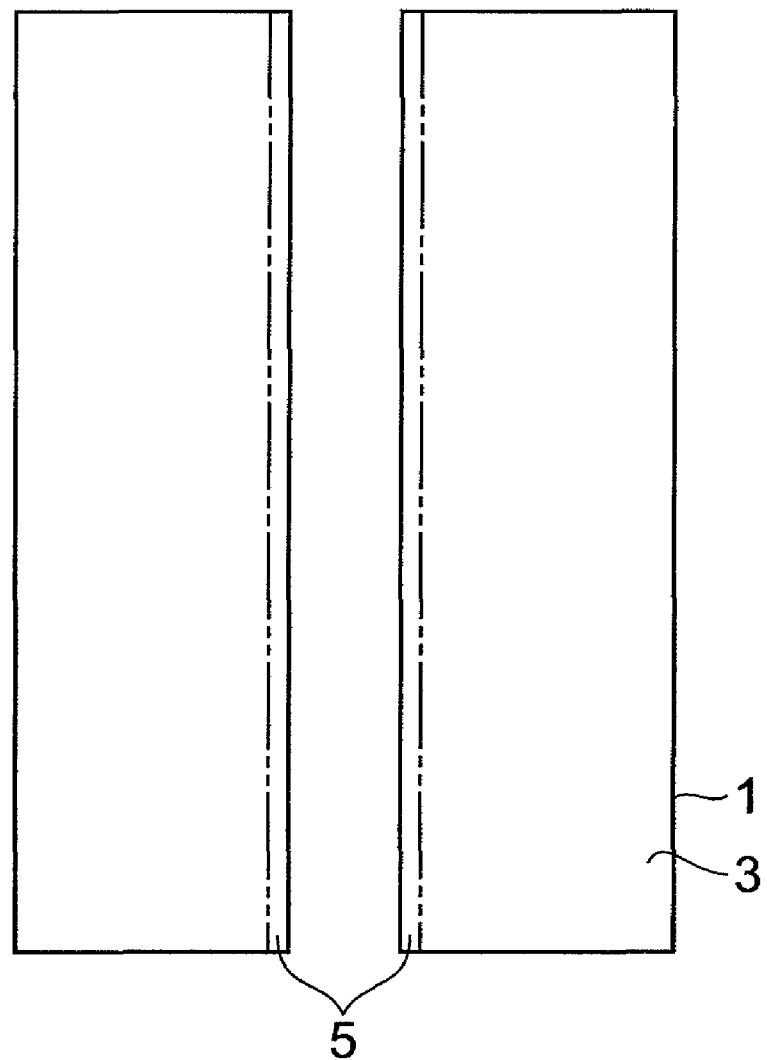
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8 thereof, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (3):

(1) Case where the Modified Region is a Crack Region Including One Crack or a Plurality of Cracks An object to be processed (e.g., glass or a piezoelectric material made of $LiTaO_3$) is irradiated with laser light while locating a converging point therewithin under a condition with a field intensity of at least $1\times10^8$ (W/cm$^2$) at the converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser Harmonics", Proceedings of the 45th Laser Materials Processing Conference (December, 1998), pp. 23-28.

The inventors determined the relationship between field intensity and crack size by an experiment. The following are conditions of the experiment.

(A) Object to be Processed: Pyrex (Registered Trademark) Glass (with a Thickness of 700 µm)

(B) Laser light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: output<1 mJ/pulse
laser light quality: $TEM_{00}$
polarizing property: linear polarization (C) Condenser Lens transmittance at a laser light wavelength: 60%

(D) Moving Rate of the Mount Table Mounting the Object: 100 mm/sec

The laser light quality of $TEM_{00}$ means that the converging characteristic is so high that convergence to about the wavelength of laser light is possible.

Figure 7:
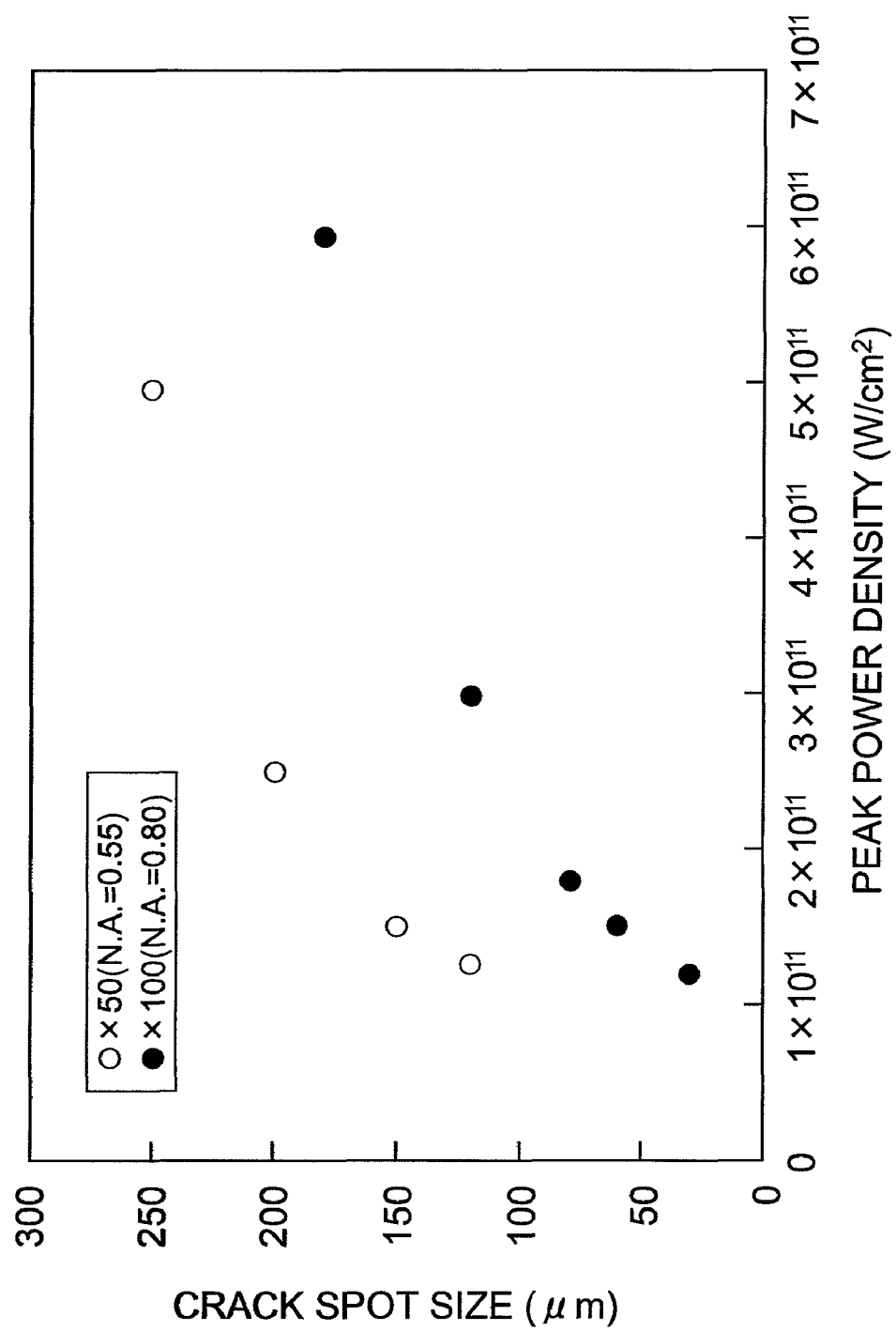
FIG. 7 is a graph showing relationships between the peak power density and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
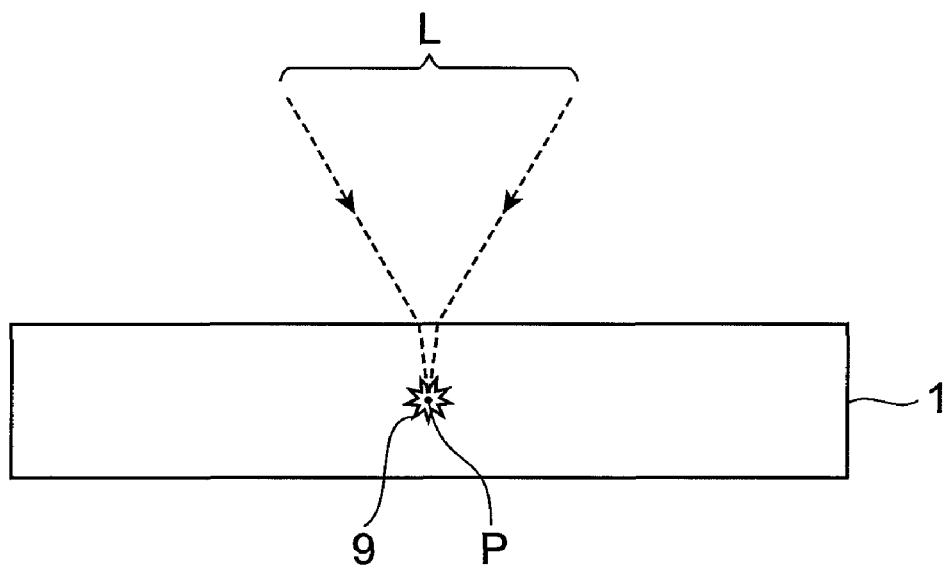
FIG. 8 is a sectional view of the object in a first step of the laser processing method in accordance with the embodiment.
Figure 9:
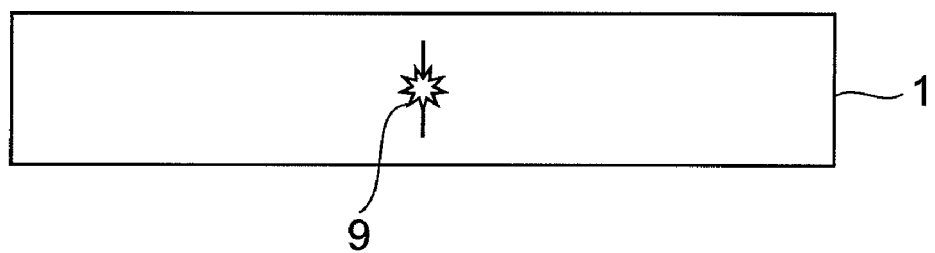
FIG. 9 is a sectional view of the object in a second step of the laser processing method in accordance with the embodiment.
Figure 10:
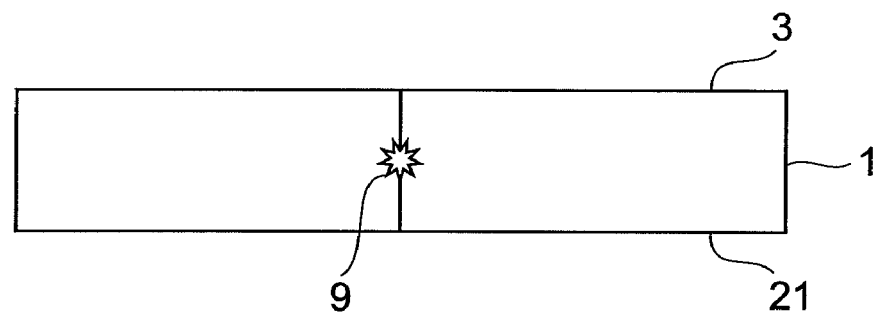
FIG. 10 is a sectional view of the object in a third step of the laser processing method in accordance with the embodiment.
Figure 11:
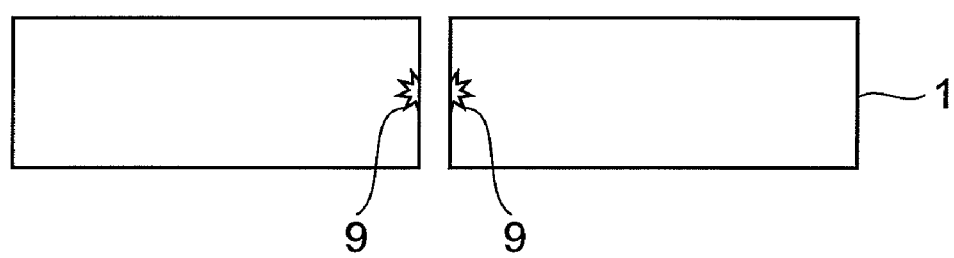
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be Processed: Silicon Wafer (with a Thickness of 350 µm and an Outer Diameter of 4 Inches)

(B) Laser light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: 20 µJ/pulse
laser light quality: $TEM_{00}$
polarizing property: linear polarization (C) Condenser Lens magnification: ×50
N.A.: 0.55
transmittance at a laser light wavelength: 60%

(D) Moving Rate of the Mount Table Mounting the Object: 100 mm/sec

Figure 12:
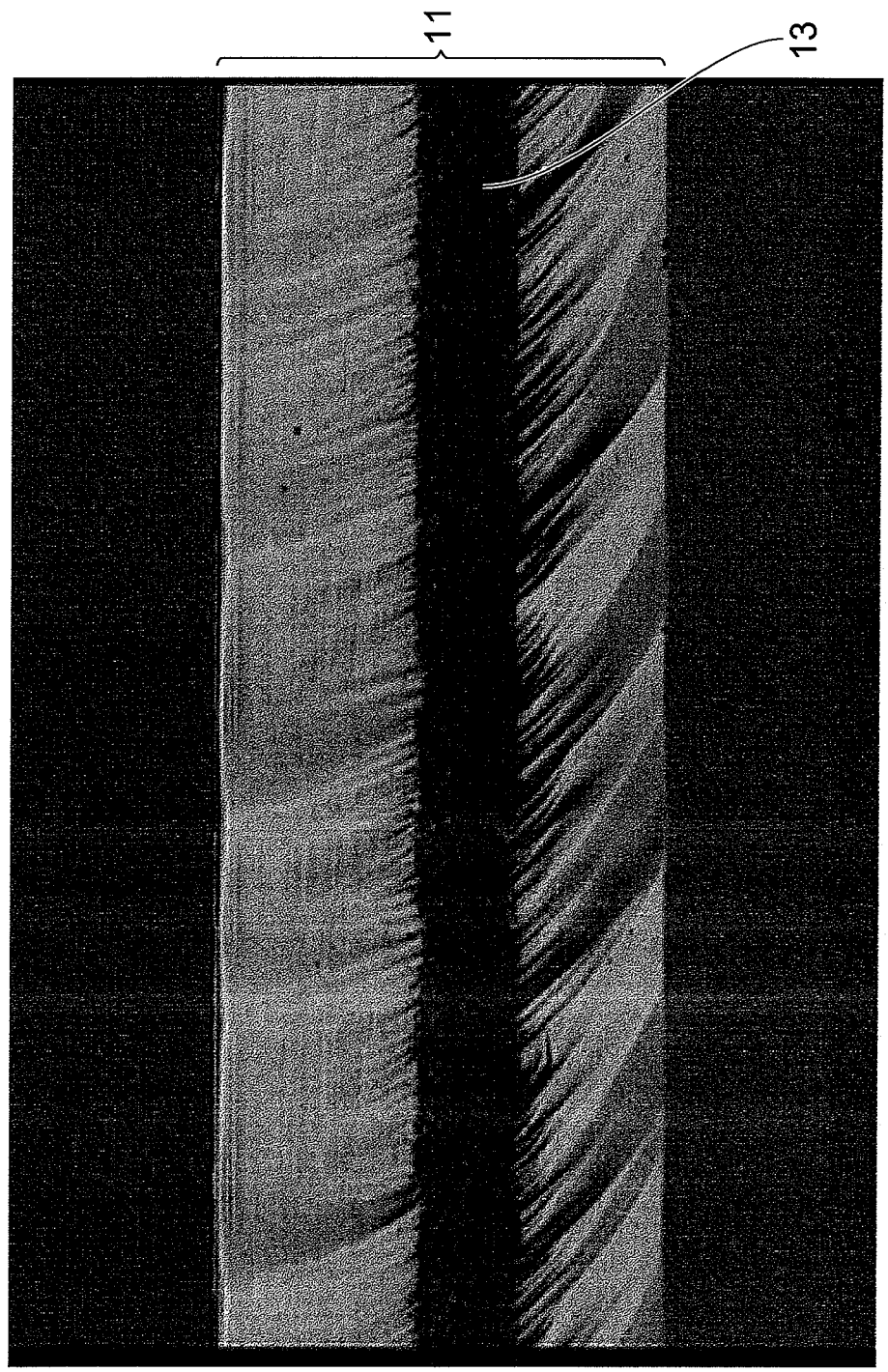
FIG. 12 is a view showing a photograph of a cut section in a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 µm in the thickness direction.

Figure 13:
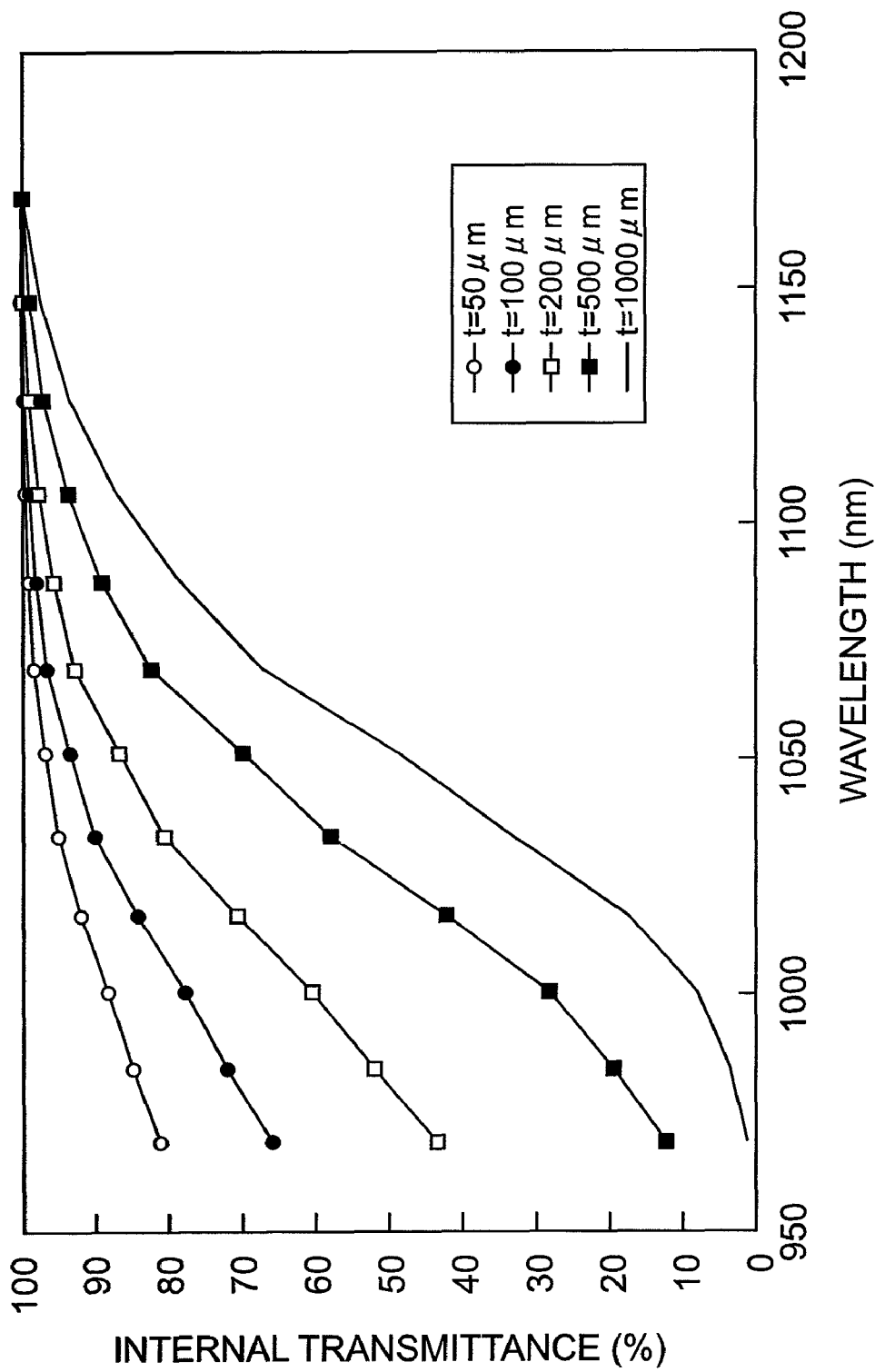
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light appears to be transmitted through the silicon substrate by at least 80% when the silicon substrate has a thickness of 500 µm or less. Since the silicon wafer 11 shown in FIG. 12 has a thickness of 350 µm, the molten processed region 13 caused by multiphoton absorption is formed near the center of the silicon wafer 11, i.e., at a part distanced from the front face by 175 µm. The transmittance in this case is 90% or more with reference to a silicon wafer having a thickness of 200 µm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case where the Modified Region is a Refractive Index Change Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (3) are explained in the foregoing as modified regions. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

Preferred embodiments of the present invention will now be explained.

First Embodiment

Figure 14:
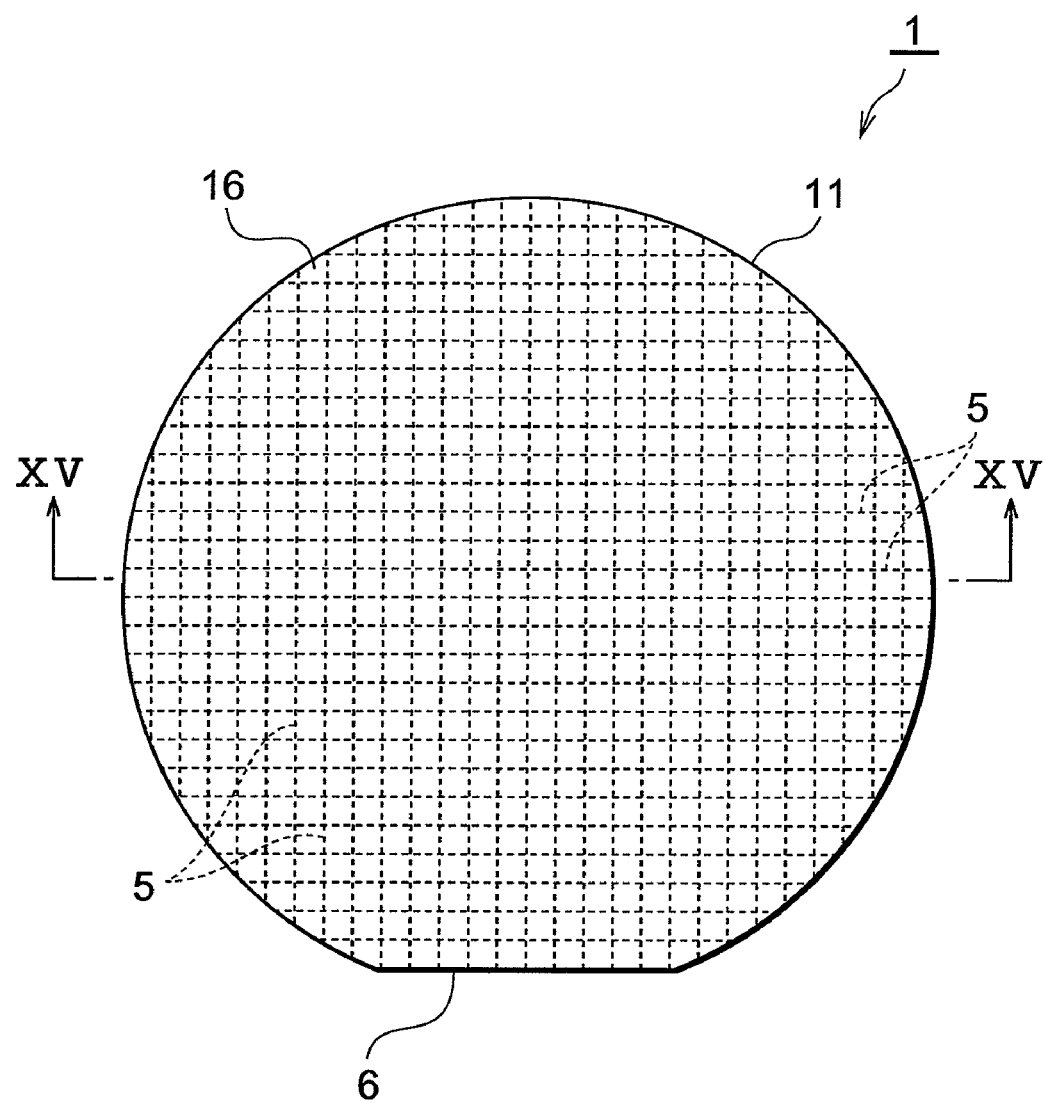
FIG. 14 is a plan view of an object to be processed by the laser processing method in accordance with a first embodiment.
Figure 15:
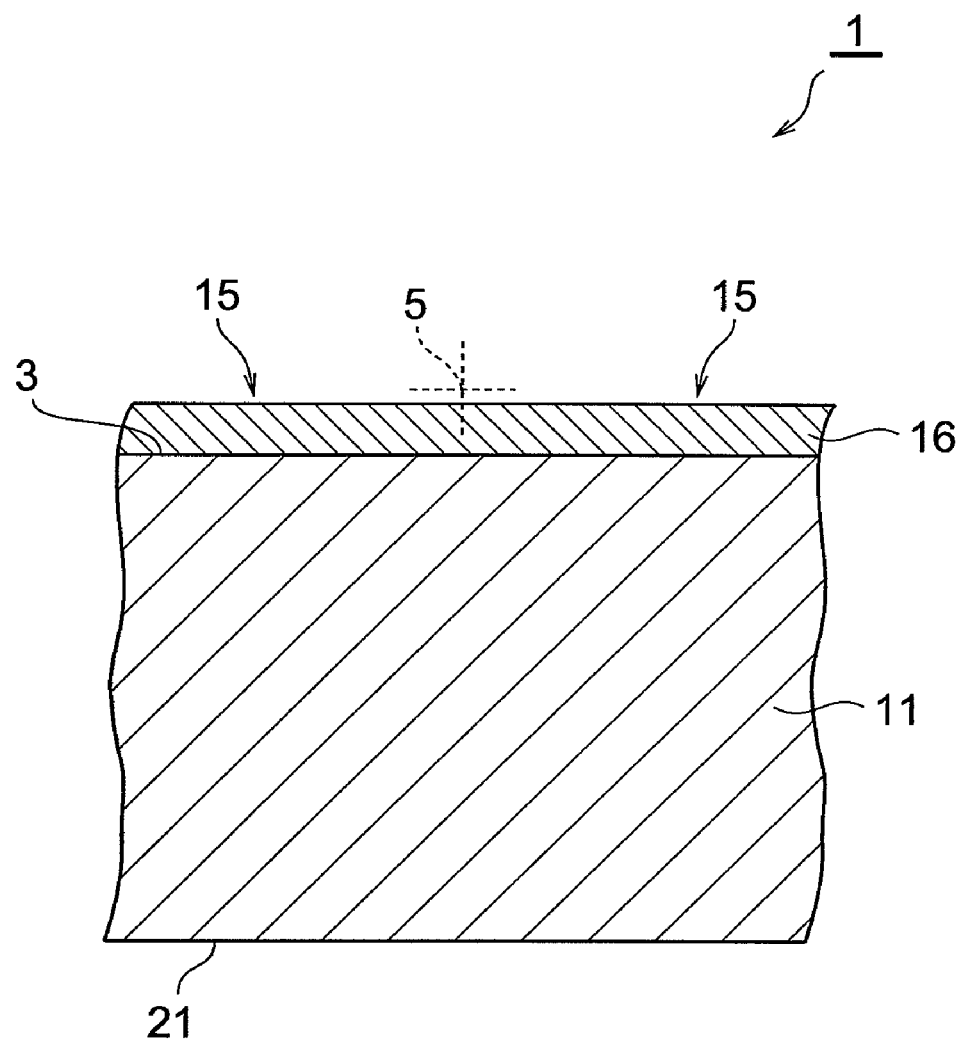
FIG. 15 is a partial sectional view taken along the line XV-XV of FIG. 14.

As shown in FIGS. 14 and 15, an object to be processed 1 comprises a silicon wafer (semiconductor substrate) 11 having a thickness of 625 µm, and a functional device layer 16 which is formed on the front face 3 of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Figure 16:
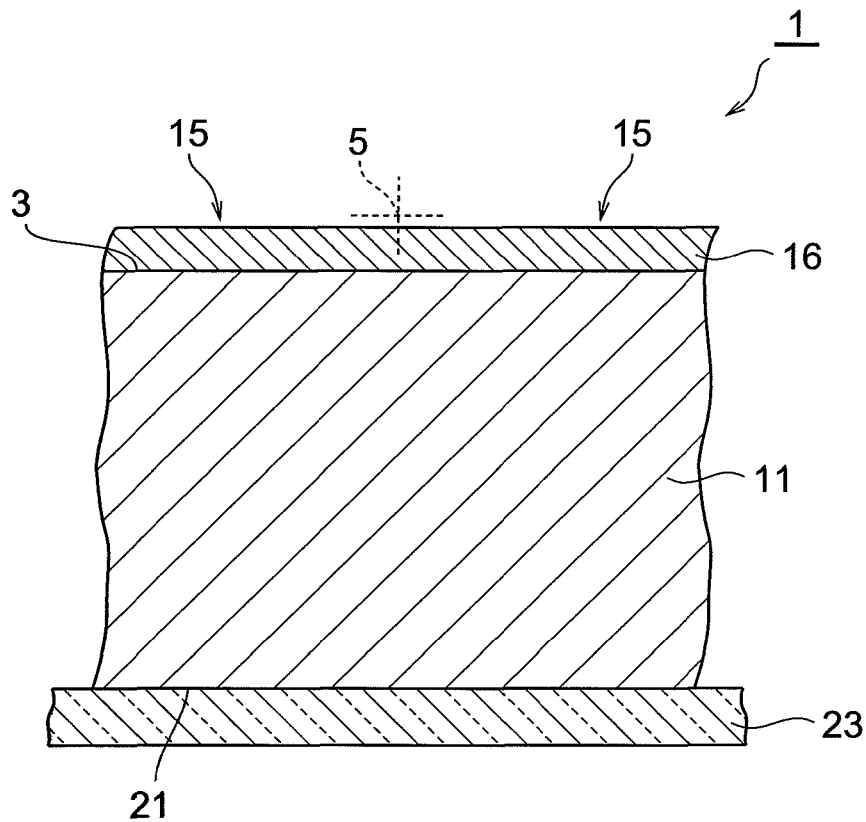
FIG. 16 is a sectional view of a part of the object for explaining the laser processing method in accordance with the first embodiment, in which (a) shows a state where an expandable tape is attached to the object, while (b) shows a state where the object is irradiated with laser light.
Figure 16:
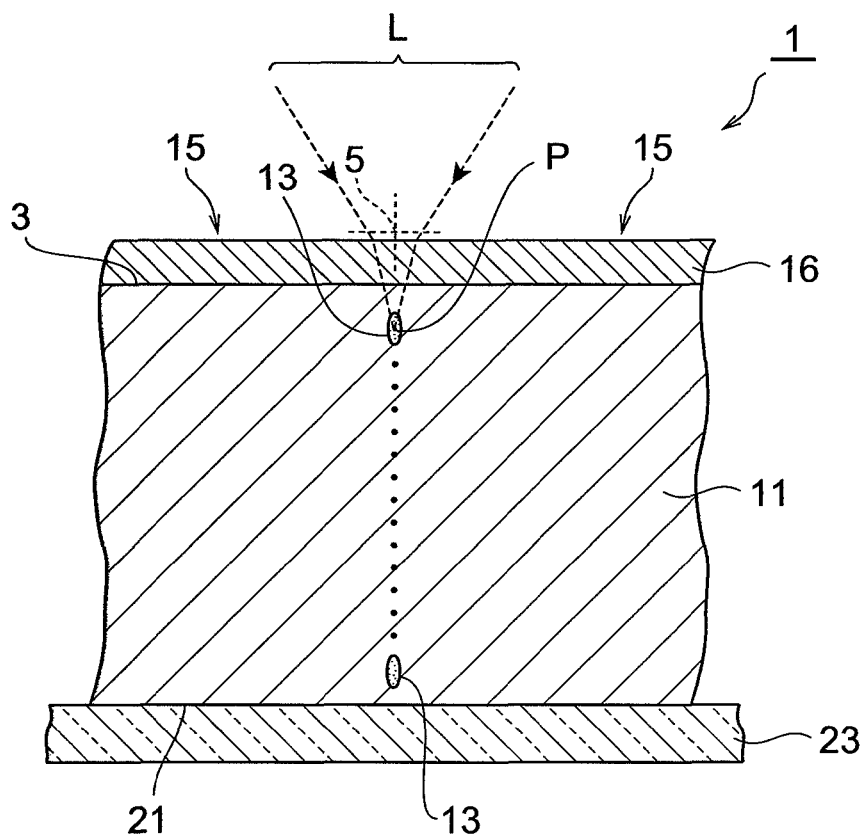

Thus constructed object 1 is cut into the functional devices 15 as follows. First, as shown in FIG. 16(a), an expandable tape (sheet) 23 is attached to the rear face 21 of the silicon wafer 11. Subsequently, as shown in FIG. 16(b), the object 1 is secured onto a mount table of a laser processing apparatus (not shown) such that the functional device layer 16 faces up. Then, the silicon wafer 11 is irradiated with laser light L while using the front face 3 of the silicon wafer 11 as a laser light entrance surface and locating a converging point P within the silicon wafer 11, and the mount table is moved such as to scan the converging point P along lines to cut 5 (see broken lines of FIG. 14) which are set like grids passing between the functional devices 15, 15 adjacent to each other.

Each line to cut 5 is scanned with the converging point P a plurality of (e.g., 19) times with respective distances from the front face 3 to the position at which the converging point P is focused, whereby a plurality of rows of molten processed regions 13 are formed along the line to cut 5 one by one within the silicon wafer 11 successively from the rear face 21 side. When a plurality of rows of molten processed regions 13 are thus formed one by one successively from the rear face 21 side, no molten processed region 13 exists between the front face 3 on which the laser light L is incident and the converging point P of the laser light L at the time of forming each molten processed region 13. Therefore, no laser light L is scattered, absorbed, and so forth by the molten processed regions 13 that have already been formed. Hence, each molten processed region 13 can reliably be formed within the silicon wafer 11 along the line to cut 5. Fractures may occur from the molten processed regions 13 so as to reach the front or rear face of the object 1. The molten processed regions 13 may include cracks mixed therein. The number of rows of molten processed regions 13 formed within the silicon wafer 11 for one line to cut 5 varies depending on the thickness of the silicon wafer 11 and the like and may be 1 without being restricted to plural numbers.

Figure 17:
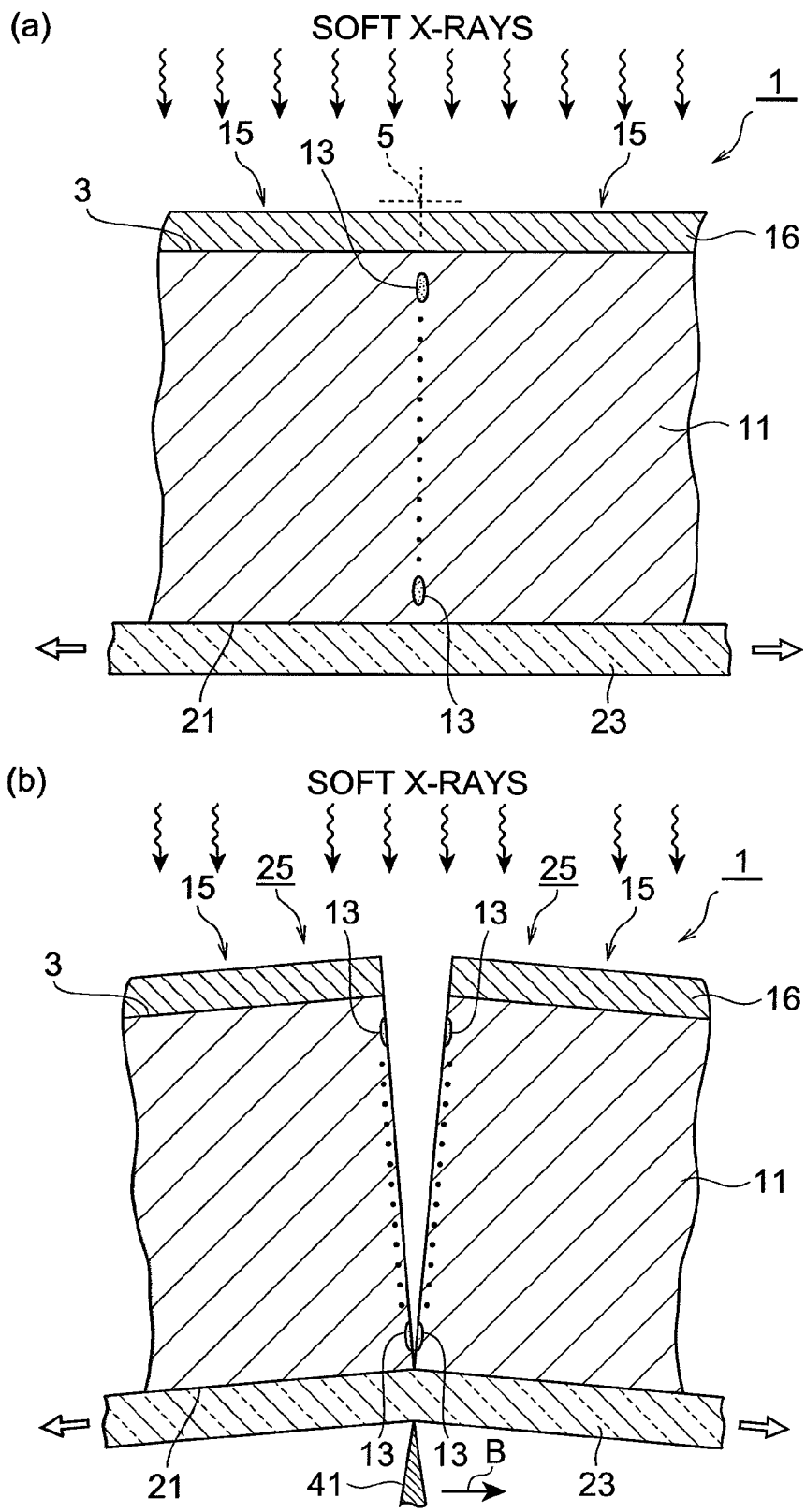
FIG. 17 is a sectional view of a part of the object for explaining the laser processing method in accordance with the first embodiment, in which (a) shows a state where the expandable tape is expanded, while (b) shows a state where a knife edge is pressed against the object through the expandable tape.

Subsequently, as shown in FIG. 17(a), a destaticizer of soft x-ray irradiation type (not depicted) emits soft x-rays (3 keV to 9.5 keV), so that an atmosphere surrounding the object is ionized by photoionization. In this state, the expandable tape 23 is expanded. Then, in the state irradiated with the soft x-rays while the expandable tape 23 is expanded as shown in FIG. 17(b), a knife edge (pressing member) 41 is pressed against the rear face 21 of the silicon wafer 11 through the expandable tape 23 and moved in the direction of arrow B. As a consequence, a bending stress acts on the object 1, whereby the object 1 is cut along the line to cut 5. Since the expandable tape 23 is expanded here, a plurality of semiconductor chips (chips) 25 obtained by cutting are separated from each other in the state irradiated with the soft x-rays as shown in FIG. 18 immediately after the object 1 is cut.

Destaticizers of soft x-ray irradiation type have publicly been known as disclosed in Japanese Patent Nos. 2951477 and 2749202. An example of their products is one named "Photoionizer" (product number L9490) manufactured by Hamamatsu Photonics K.K.

Figure 18:
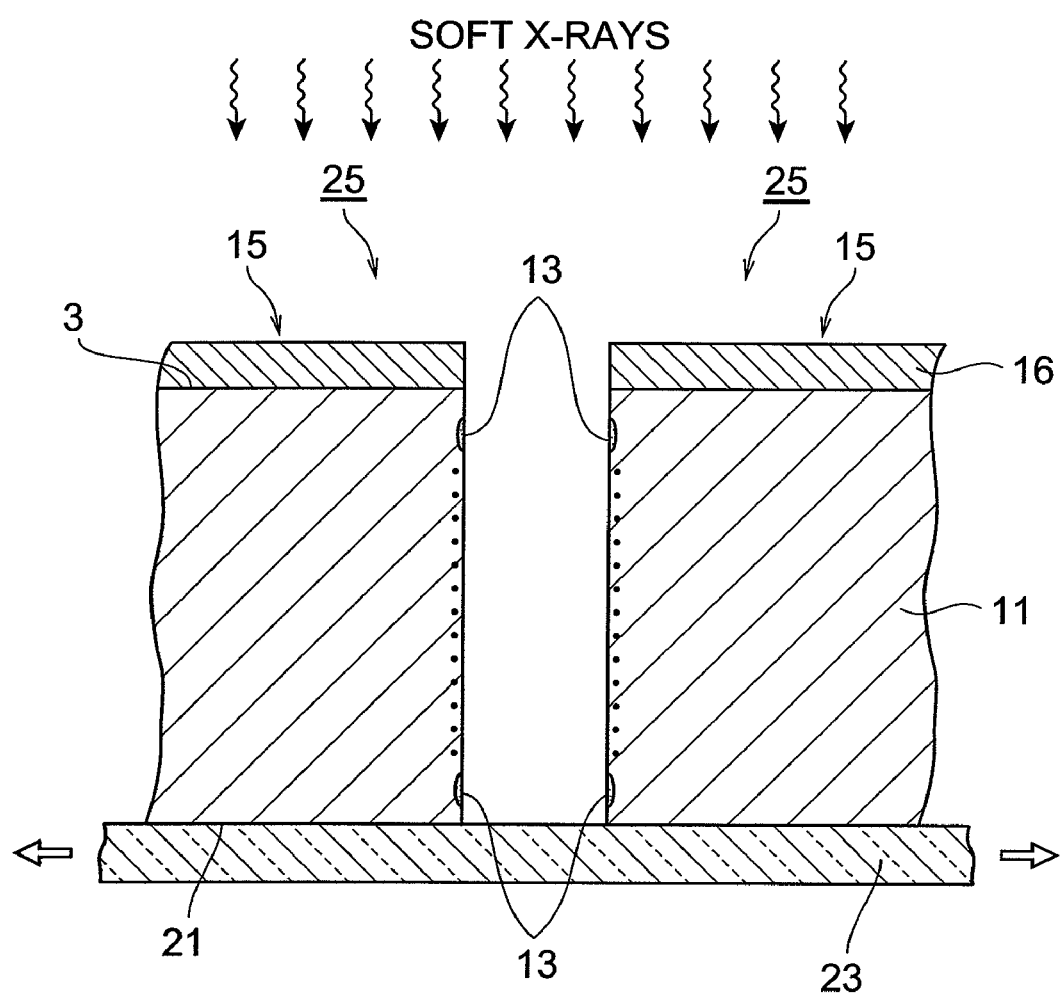
FIG. 18 is a sectional view of a part of the object for explaining the laser processing method in accordance with the first embodiment, showing a state where the object is cut into semiconductor chips.

In the laser processing method in accordance with the first embodiment, as explained in the foregoing, forming materials of the object 1 (the object 1 formed with the molten processed regions 13, the semiconductor chips 25 obtained by cutting the object 1, particles produced from cut sections of the semiconductor chips 25, and the like) are irradiated with soft x-rays at the time of applying a stress to the object 1 through the expandable tape 23 (see FIGS. 17(a), (b) and FIG. 18). As a consequence, particles produced from cut sections of the semiconductor chips 25 obtained by cutting the object 1 fall on the expandable tape 23 without dispersing randomly. Therefore, the laser processing method in accordance with the first embodiment can securely prevent particles from attaching to the semiconductor chips 25 obtained by cutting the object 1.

A principle by which particles produced from cut sections of the semiconductor chips 25 fall on the expandable tape 23 when the forming materials of the object 1 are irradiated with soft x-rays at the time of applying a stress to the object 1 through the expandable tape 23 will now be studied.

Figure 19:
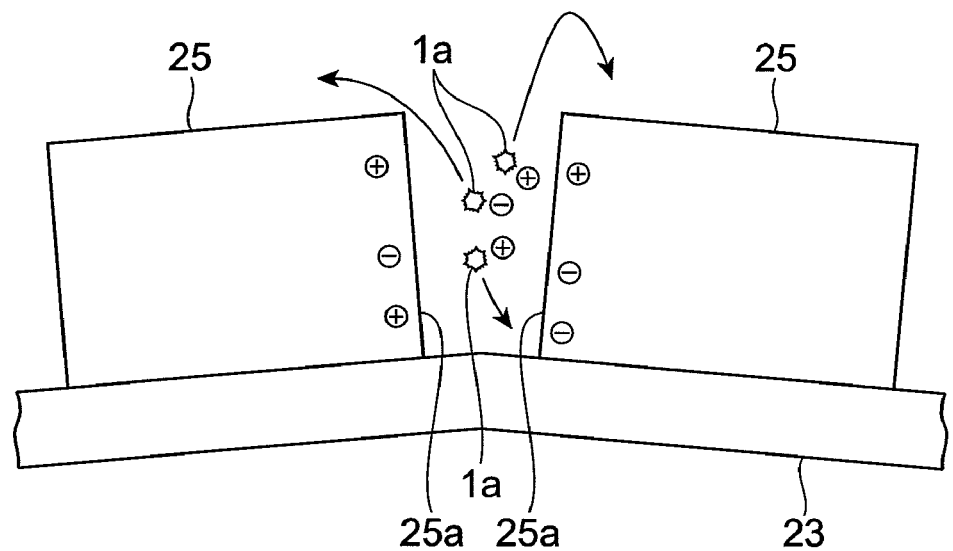
FIG. 19 is a schematic view for explaining a principle by which particles produced from cut sections of the semiconductor chips disperse randomly.
Figure 19:
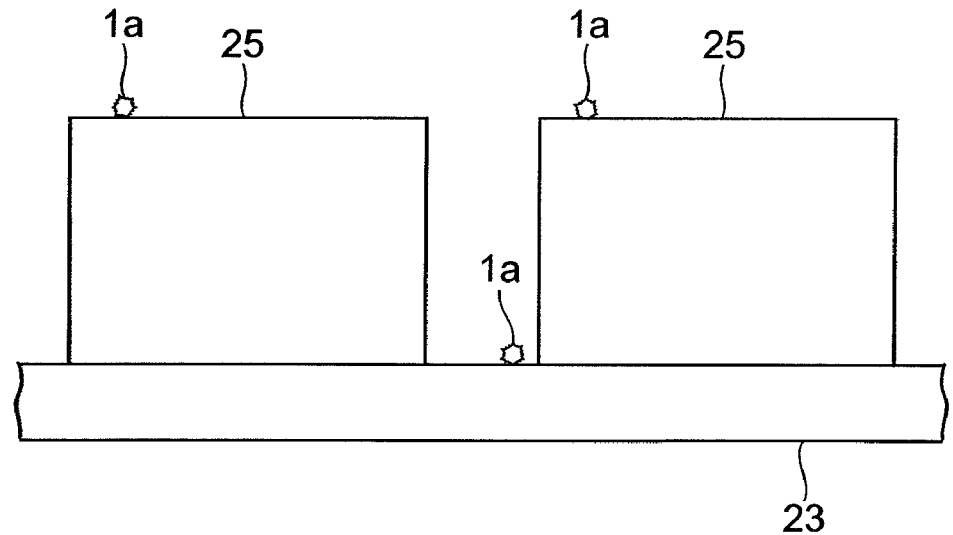

When the object 1 is cut into a plurality of semiconductor chips 25 in the case where the forming materials of the object 1 are not irradiated with soft x-rays, particles 1a produced from cut sections 25a, 25a of the semiconductor chips 25 are randomly charged by peeling electrification. Therefore, the particles 1a are randomly dispersed by electric repulsion from the cut sections 25a. As a result, a part of randomly dispersed particles 1a attach to the semiconductor chips 25 as shown in FIG. 19(b).

Figure 20:
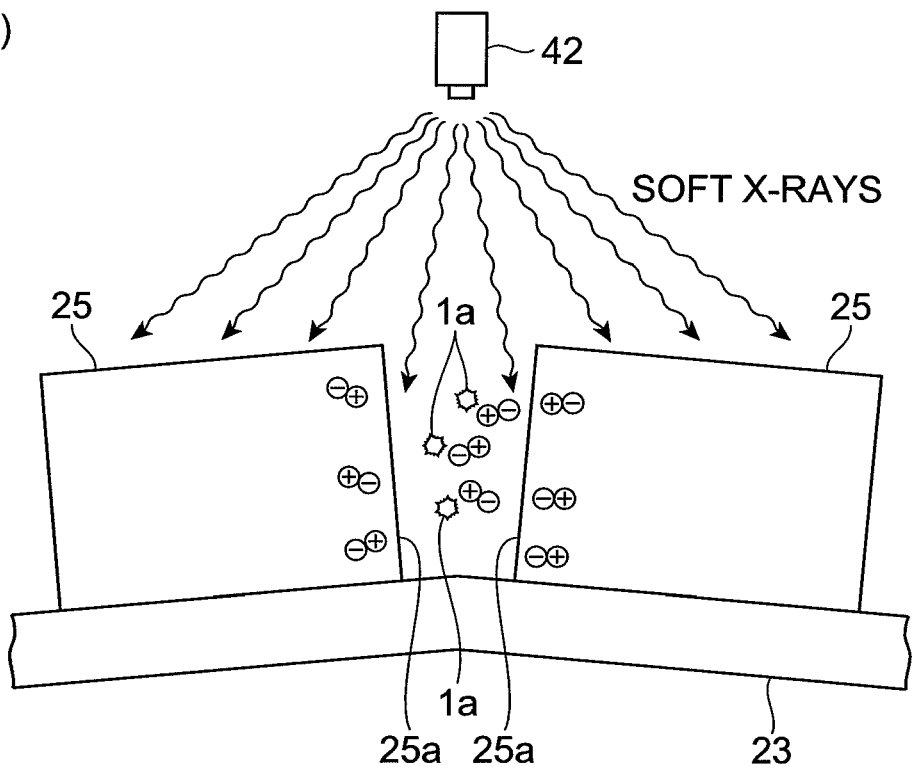
FIG. 20 is a schematic view for explaining a principle by which the particles produced from the cut sections of the semiconductor chips fall under their own weight.
Figure 20:
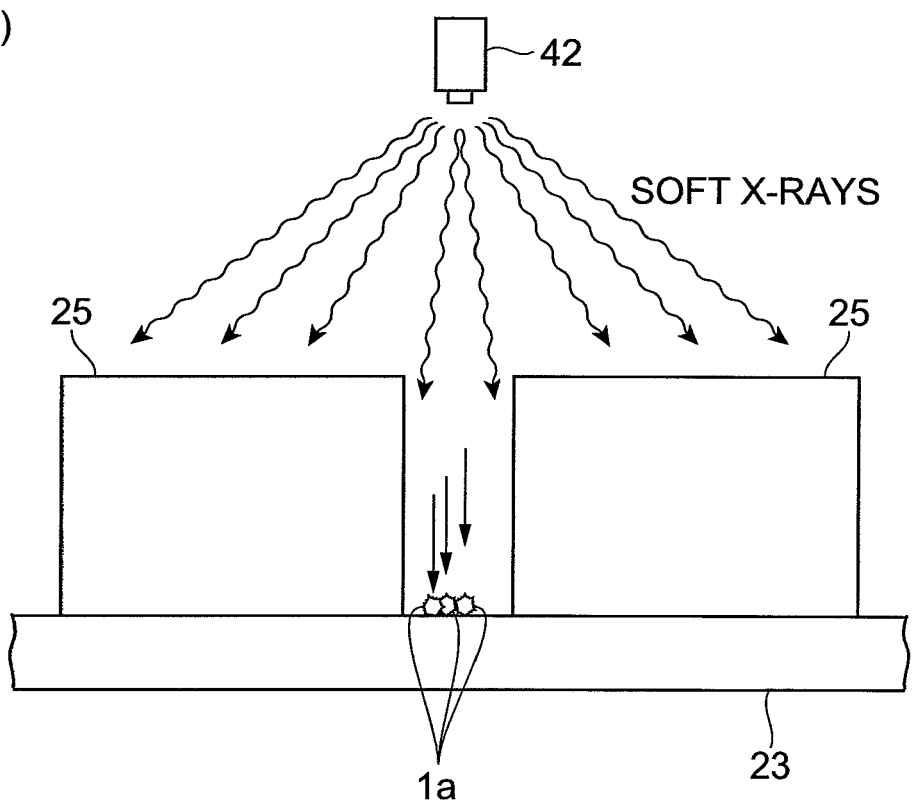

In the case where the forming material of the object 1 is irradiated with the soft x-rays from a destaticizer of soft x-ray irradiation type 42, on the other hand, the atmosphere surrounding the object 1 is ionized by photoionization, whereby the particles 1a produced by the cut sections 25a, 25a of the semiconductor chips 25 are electrically neutralized as shown in FIG. 20(a), so as to be kept from being randomly charged by peeling electrification. As a consequence, the particles 1a fall under their own weight and are secured onto the expandable tape 23 as shown in FIG. 20(b).

Second Embodiment

The laser processing method in accordance with the second embodiment differs from that of the first embodiment in that the knife edge 41 is not pressed against the rear face 21 of the silicon wafer 11 through the expandable tape 23 in the state irradiated with the soft x-rays while the expandable tape 23 is expanded.

First, as shown in FIG. 16(a), the expandable tape 23 is attached to the rear face 21 of the silicon wafer 11. Then, as shown in FIG. 16(b), the silicon wafer 11 is irradiated with the laser light L while using the front face 3 of the silicon wafer 11 as a laser light entrance surface and locating the converging point P within the silicon wafer 11, so as to form a plurality of rows of molten processed regions 13 within the silicon wafer 11 along the line to cut 5.

Subsequently, as shown in FIG. 17(a), the destaticizer of soft x-ray irradiation type (not depicted) emits the soft x-rays, so as to ionize the atmosphere surrounding the object 1 by photoionization, and the expandable tape 23 is expanded in this state. This cuts the object 1 into a plurality of semiconductor chips 25 along the line to cut 5 from the molten processed regions 13 acting as cutting start points and separates the plurality of semiconductor chips 25 obtained by cutting from each other as shown in FIG. 18.

In the laser processing method in accordance with the second embodiment, as explained in the foregoing, the forming materials of the object 1 (the object 1 formed with the molten processed regions 13, the semiconductor chips 25 obtained by cutting the object 1, particles produced from cut sections of the semiconductor chips 25, and the like) are irradiated with the soft x-rays at the time of applying a stress to the object 1 through the expandable tape 23 (see FIGS. 17(a) and 18). As a consequence, particles produced from cut sections of the semiconductor chips 25 obtained by cutting the object 1 along the lines to cut 5 from the molten processed regions 13 acting as cutting start points fall on the expandable tape 23 without dispersing randomly. Therefore, the laser processing method in accordance with the second embodiment can securely prevent the particles from attaching to the semiconductor chips 25 obtained by cutting the object 1.

The number of particles on the surface of the semiconductor chips 25 and the number of particles on the surface of the expandable tape 23 in each of the respective cases where a plurality of semiconductor chips 25 are obtained in conformity with the above-mentioned first and second embodiments will now be explained.

The numbers of particles in the following Tables 1 and 2 are results of measurement of particles having a size of 2 μm or greater when 19 rows of molten processed regions 13 were formed for each line to cut 5 within the silicon wafer 11 having a thickness of 625 μm and an outer diameter of 100 mm, so as to yield the semiconductor chips 25 each having a size of 2 mm×2 mm.

TABLE 1

|  | Number of particles on semiconductor chip surface | |
| --- | --- | --- |
|  | Not irradiated with soft x-rays | Irradiated with soft x-rays |
| Case conforming to laser processing method of 1st embodiment | 35 | 0 |
| Case conforming to laser processing method of 2nd embodiment | 6 | 0 |

TABLE 2

|  | Number of particles on expandable tape surface | |
| --- | --- | --- |
|  | Not irradiated with soft x-rays | Irradiated with soft x-rays |
| Case conforming to laser processing method of 1st embodiment | 12 | 52 |
| Case conforming to laser processing method of 2nd embodiment | 4 | 9 |

When the forming materials of the object 1 are not irradiated with the soft x-rays, particles attach to the surfaces of the semiconductor chip 25 and expandable tape 23 as shown in Tables 1 and 2, and thus are found to disperse randomly. When the forming materials of the object 1 are irradiated with the soft x-rays at the time of applying a stress to the object 1 through the expandable tape 23, on the other hand, particles do not attach to the surface of the semiconductor chip 25 but the surface of the expandable tape 23, and thus are found to fall under their own weight without dispersing randomly.

The present invention is not limited to the above-mentioned laser processing methods in accordance with the first and second embodiments.

For example, the molten processed regions 13 may be formed within the silicon wafer 11 along the lines to cut 5 by irradiating the silicon wafer 11 while locating the converging point P therewithin, so as to generate fractures from the molten processed regions 13 to the front and rear faces of the object 1, thereby cutting the object 1 into a plurality of semiconductor chips 25 before expanding the expandable tape 23. After forming the molten processed regions 13 within the silicon wafer 11 along the lines to cut 5 by irradiating the silicon wafer 11 with the laser light L while locating the converging point P therewithin, the object 1 may be cut into a plurality of semiconductor chips 25 by heating the object 1 with heating means or the like or by applying a stress to the object 1 with a breaker or the like before expanding the expandable tape 23. These cases will also yield effects similar to those of the above-mentioned laser processing methods in accordance with the first and second embodiments if the forming materials of the object 1 are irradiated with the soft x-rays at the time of applying a stress to the object 1 through the expandable tape 23 (i.e., at the time of separating a plurality of semiconductor chips 25 from each other by expanding the expandable tape 23).

Though the above-mentioned laser processing methods in accordance with the first and second embodiments employ the front face 3 of the silicon wafer 11 as a laser light entrance surface, the rear face 21 of the silicon wafer 11 may be used as the laser light entrance surface. When the rear face 21 of the silicon wafer 11 is used as the laser light entrance surface, the object 1 is cut into a plurality of semiconductor chips 25 as follows, for example. Namely, a protective tape is attached to the surface of the functional device layer 16. While protecting the functional device layer 16, the protective tape holding the object 1 is secured to the mount table of the laser processing apparatus. Then, the silicon wafer 11 is irradiated with the laser light L while using the rear face 21 of the silicon wafer 11 as the laser light entrance surface and locating the converging point P within the silicon wafer 11, whereby the molten processed regions 13 are formed within the silicon wafer 11 along the lines to cut 5. Subsequently, the protective tape secured to the mount table is removed together with the object 1. Then, the expandable tape 23 is attached to the rear face 21 of the silicon wafer 11, and the protective tape is peeled off from the surface of the functional device layer 16. Thereafter, while the forming materials of the object 1 are irradiated with the soft x-rays, the expandable tape 23 is expanded, so as to cut the object 1 along the lines to cut 5 from the molten processed regions 13 acting as cutting start points and separate a plurality of semiconductor chips 25 obtained by the cutting from each other.

Though the above-mentioned laser processing methods in accordance with the first and second embodiments irradiate the forming materials of the object 1 with the soft x-rays at the time of applying a stress to the object 1 through the expandable tape 23, the forming materials of the object 1 may be destaticized by any methods such as those using destaticizers of corona discharge type. Since static charges are removed from the forming materials of the object 1, particles produced from cut sections of the semiconductor chips 25 obtained by cutting the object along the lines to cut 5 from the molten processed regions 13 acting as cutting start points fall on the expandable tape 23 without dispersing randomly in this case as well. Therefore, this can also securely prevent particles from attaching to the semiconductor chips 25 obtained by cutting the object 1.

Though the molten processed regions are formed within objects to be processed which are made of semiconductor materials in the above-mentioned laser processing methods in accordance with the first and second embodiments, other modified regions such as crack regions and refractive index change regions may be formed within objects made of other materials such as glass and piezoelectric materials.

INDUSTRIAL APPLICABILITY

The present invention can securely prevent particles from attaching to chips obtained by cutting a planar object to be processed.

The invention claimed is:

1. A laser processing method comprising the steps of:
   irradiating a planar object to be processed with laser light while locating a converging point within the object, so as to form a modified region to become a cutting start point within the object along a line to cut in the object; and
   applying a stress to the object through an elastic sheet, so as to separate a plurality of chips from each other, the chips being obtained by cutting the object along the line to cut from the modified region acting as the cutting start point;
   wherein when applying the stress to the object through the sheet, a forming material of the object is irradiated with a soft x-ray from above by placing the object above the sheet so that between the separated chips particles produced from cut sections of the chips fall onto the sheet under their own weight and an atmosphere surrounding the object is ionized by photoionization.

2. A laser processing method according to claim 1, wherein the step of separating the chips from each other cuts the object along the line to cut from the modified region acting as the cutting start point by applying a stress to the object through the sheet.

3. A laser processing method according to claim 1, wherein the object is equipped with a semiconductor substrate, while the modified region includes a molten processed region.

* * * * *